United States Patent [19]
Gane et al.

[11] Patent Number: 5,838,547
[45] Date of Patent: *Nov. 17, 1998

[54] ELECTRICAL SAFETY BARRIER

[75] Inventors: Bernard John Gane, Harpenden; Laurence Albert Fletcher, Barton Le Clay, both of England

[73] Assignee: MTL Instruments Group plc, Bedfordshire, England

[ * ] Notice: This patent issued on a continued prosecution application filed under 37 CFR 1.53(d), and is subject to the twenty year patent term provisions of 35 U.S.C. 154(a)(2).

[21] Appl. No.: 518,899

[22] Filed: Aug. 24, 1995

[30]  Foreign Application Priority Data

Aug. 26, 1994 [GB] United Kingdom .................. 9417235

[51] Int. Cl.⁶ ...................................................... H05K 1/16
[52] U.S. Cl. ......................... 361/765; 361/673; 338/195; 338/308
[58] Field of Search ..................................... 361/673, 730, 361/825, 760, 765, 766; 338/195, 20, 21, 306–309

[56]  References Cited

U.S. PATENT DOCUMENTS

| | | | |
|---|---|---|---|
| 3,614,539 | 10/1971 | Hallenbeck | 361/837 |
| 3,887,848 | 6/1975 | Larson et al. | 317/33 |
| 4,099,216 | 7/1978 | Weberg | 361/56 |
| 4,260,849 | 4/1981 | Kirby | 361/825 |
| 4,388,665 | 6/1983 | Putz | 361/637 |
| 4,420,840 | 12/1983 | Livermore | 359/144 |
| 4,467,310 | 8/1984 | Jakab | 338/22 |
| 4,792,646 | 12/1988 | Enomoto | 174/68 |
| 5,014,156 | 5/1991 | Bruch et al. | 361/58 |
| 5,029,789 | 7/1991 | Nourry et al. | 361/673 |
| 5,103,373 | 4/1992 | Rusch et al. | 361/673 |
| 5,119,272 | 6/1992 | Ohyama et al. | 361/765 |
| 5,504,470 | 4/1996 | Ginn | 338/20 |
| 5,537,288 | 7/1996 | Felps | 361/124 |

FOREIGN PATENT DOCUMENTS

| | | | |
|---|---|---|---|
| 0 603 026 | 6/1994 | European Pat. Off. | |
| 3424572 | 1/1986 | Germany | H05K 5/06 |
| 1 291 952 | 10/1972 | United Kingdom | |
| 2205448 | 12/1988 | United Kingdom | H01C 17/24 |

OTHER PUBLICATIONS

Draft European Standard pr EN50 020 believed to have been published in Feb. of 1990.

Primary Examiner—Leo P. Picard
Assistant Examiner—John B. Vigushin
Attorney, Agent, or Firm—Seidel, Gonda, Lavorgna & Monaco, PC

[57] ABSTRACT

An electrical safety barrier for use as a protective device between a hazardous area and a non-hazardous area has a substrate of ceramic material which carries thick film printed resistors and other surface mounted safety components, such as Zener diodes. By using such hybrid circuit technology one can achieve a very slim barrier, reduce the number of soldered connections usually required, and obtain high power density due to the high thermal conductivity of the ceramic. The ceramic substrate is encapsulated within a housing which includes a ground shoe assembly to enable the barrier to be mounted on a rail.

6 Claims, 4 Drawing Sheets

ELECTRICAL SAFETY BARRIER

FIELD OF THE INVENTION

This invention relates to electrical safety barriers for use as protective devices between hazardous areas and non-hazardous areas. It is particularly concerned with shunt-diode safety barriers.

Existing electrical safety barriers are generally relatively thick items structurally and have circuit components, such as diodes, resistors and fuses, wired by their leads to a circuit board. Not only are the barriers relatively thick but they also have a large number of soldered connections.

SUMMARY OF THE INVENTION

It is an object of the present invention to provide an electrical safety barrier which is substantially slimmer than conventional barriers but which will still meet all the necessary certification requirements of the certification bodies. A barrier having an overall thickness of 7 mm or less is achievable. As a consequence, one can achieve a much improved packing density when a plurality of safety barriers are mounted in a side-by-side array on a common rail. One can have more barriers on a given length of rail, or accommodate a given number of barriers on a shorter rail. A reduction of the thickness to 7 mm also enables the barriers then to match the thickness of the terminal fittings customarily used on DIN rails.

Reducing the thickness of the barrier means that one has to consider the question of heat dissipation and the avoidance of hot spots. This applies particularly to the resistors in the barrier circuitry. One needs resistors having a relatively high power rating, but conventional leaded resistors with such ratings are bulky. Standard chip resistors are not suitable. They cannot handle the power requirements. Also, higher power rated chip resistors are manufactured only in a few ohmic values. One would therefore need custom-made resistors, with the consequent expense.

It is another object of the invention to provide an electrical safety barrier which has a high power density.

These objects are achieved in accordance with the present invention by the use of hybrid circuit technology.

In accordance with the present invention there is provided an electrical safety barrier wherein electrical circuit components of the barrier are carried by a substrate, characterised in that the substrate is a ceramic material.

Preferably, the ceramic substrate carries thick film printed resistors.

Preferably, the ceramic substrate carries surface mounted safety components.

The surface mounted components may include Zener diodes and rectifier diodes.

It is considered to be novel and inventive to apply hybrid circuit technology to electrical safety barriers. By doing so one can achieve a slim barrier. The thick film resistors can have high power ratings but yet take up negligible volume. Also, the surface mounted components take up less space than their leaded counterparts.

One also has the advantage that higher power densities can be achieved, due to the high thermal conductivity of the ceramic substrate. The ceramic substrate dissipates heat well and reduces the likelihood of the occurrence of hot spots.

A further advantage of the safety barrier of the present invention is that with the use of thick film printed resistors one reduces the number of soldered connections as compared with conventional barriers.

BRIEF DESCRIPTION OF THE DRAWINGS

In order that the invention may be more fully understood, one presently preferred embodiment of electrical safety barrier in accordance with the invention will now be described by way of example and with reference to the accompanying drawings. In the drawings.

DESCRIPTION OF THE PREFERRED EMBODIMENTS

Figure 1:
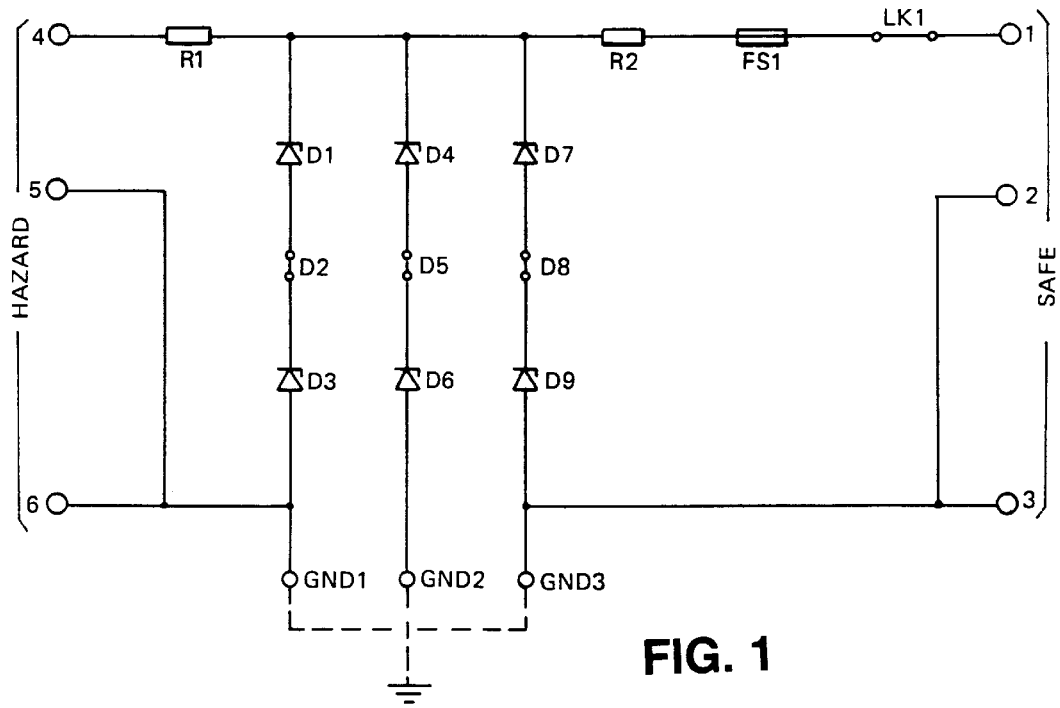
FIG. 1 is a circuit diagram of a typical shunt-diode safety barrier.

FIG. 1 illustrates a typical shunt-diode safety barrier circuit for connection between a hazardous area and a non-hazardous (safe) area. The safe side terminals are indicated as 1, 2 and 3 and the hazardous side terminals as 4, 5 and 6.

Connected to the hazardous side terminal 4 is a current limiting circuit R1 comprising a resistor or resistors. This circuit limits the current into the hazardous area. Connected in shunt with circuit R1 are voltage limiting zener diodes D1, D3, D4, D6, D7 and D9. The zener diodes are provided in pairs D1+D3, D4+D6 and D7+D9 so that the maximum zener voltage for each pair does not exceed a predetermined voltage. The connections D2, D5 and D8 are 0 ohm links. The zener diodes D3, D6, and D9 are respectively connected to earthing terminals GND1, GND2 and GND3. In series with the current limiting circuit R1 is a resistor or resistors R2 for limiting the surge current into the voltage limiting diodes when a safety fuse FS1 is blowing. The fuse FS1 protects the voltage limiting diodes from overload. A link LK1 connects the fuse FS1 to the safe side terminal 1.

The zener diodes may be for example 1 SMB 59xxBT3 zener diodes. The resistors R1 and R2 are preferably thick film resistors, with R1>3.4 watts and R2>0.12 watts. The fuse FS1 is for example a 50 mA fuse with a 4000A breaking capacity.

This barrier circuit is shown simply to indicate the type of components which one would find present in an electrical safety barrier. It is not to be regarded as in any way limiting the scope of the invention.

Figure 4:
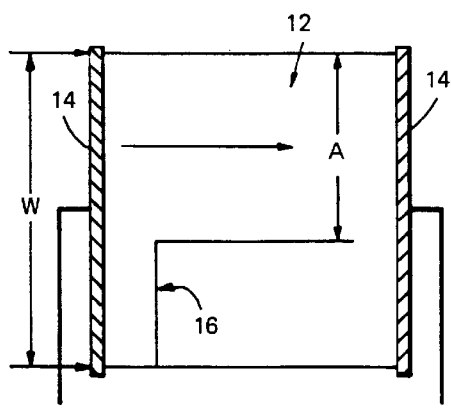
FIG. 4 shows how a thick film type resistor is produced on the pcb.
Figure 5:
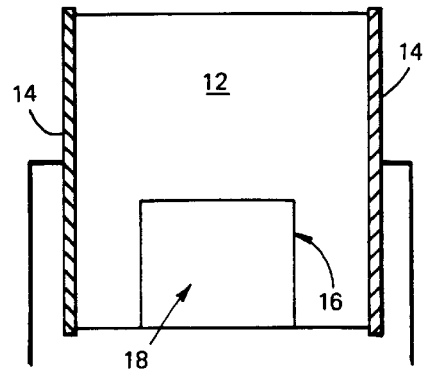
FIG. 5 illustrates a preferred thick film resistor configuration.
Figure 2:
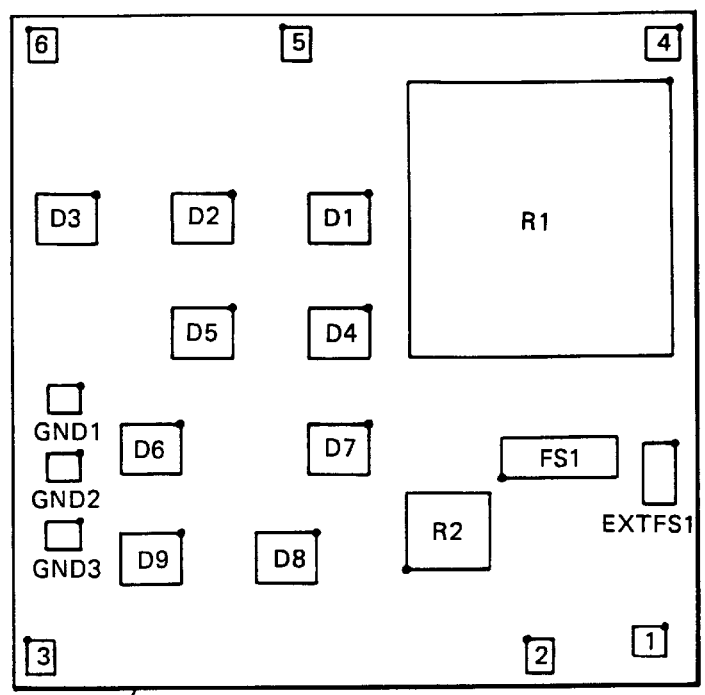
FIG. 2 is a diagrammatic representation of the pcb component layout in accordance with the invention for the safety barrier of FIG. 1.
Figure 3:
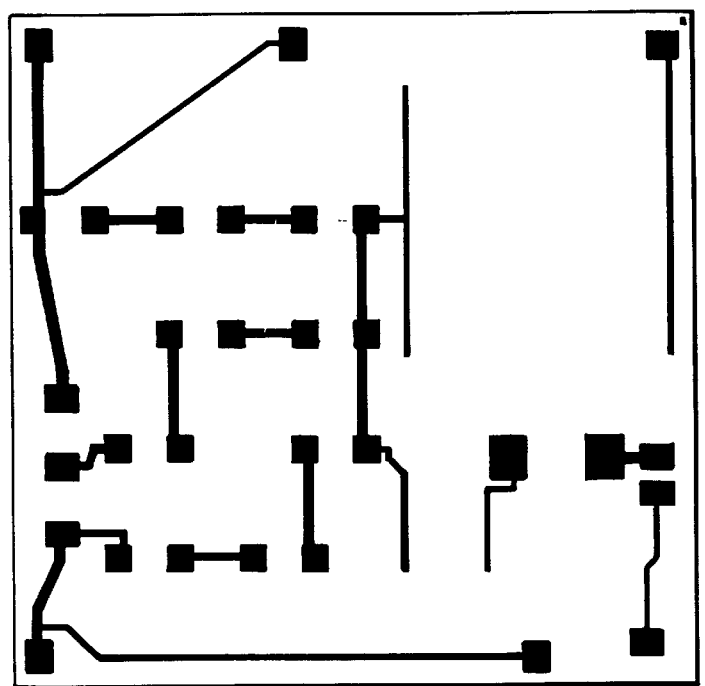
FIG. 3 shows the pcb track layout for the component layout of FIG. 2.
Figure 6:
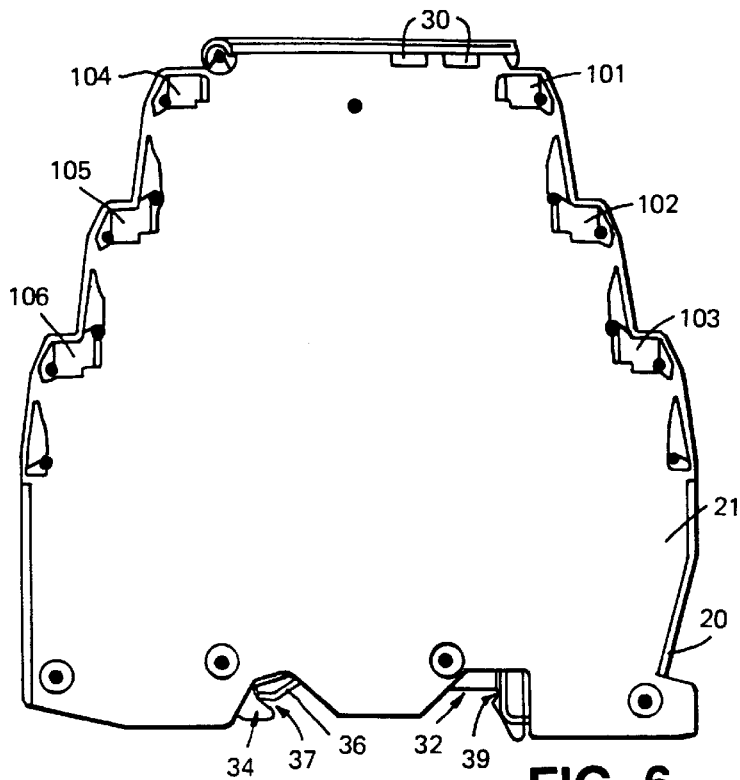
FIG. 6 is a front view showing the general assembly of a safety barrier incorporating the pcb of FIGS. 2 and 3.
Figure 7:
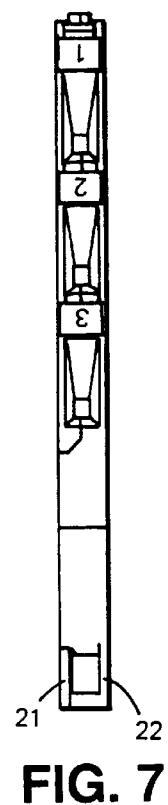
FIG. 7 is the view from the right-hand side of FIG. 6, showing the safe area terminals.
Figure 8:
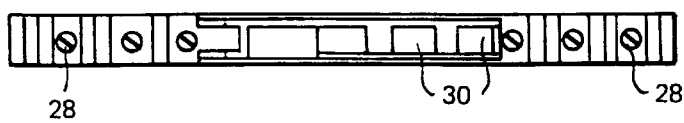
FIG. 8 is the top plan view of the barrier shown in FIG. 6.

In accordance with the invention, and as shown in FIGS. 2 and 3, the safety components of the barrier are mounted on a ceramic substrate 10 which here is shown as a square plate, for example of the order of 50 mm square and 1 mm thick. The substrate 10 functions as a printed circuit board (pcb). It preferably comprises of the order of 96% alumina. FIG. 2 shows the component layout and FIG. 3 the corresponding pcb tracks. Here, an external fuse EXTFSI is shown in addition to fuse FSI. Each of the thick film resistors R1, R2 is laid between two pcb tracks. The resistors can be produced by a printing process, using DuPont type HS80 resistor ink between the tracks, trimmed to the correct resistor value by cutting a line in the ink using a laser. FIG. 4 shows ink 12 between resistor pads 14. The laser cut is indicated at 16. Only a partial cut is shown in FIG. 4. This partial cut 16 leaves a current path of width A as indicated by the arrow. The overall width at the pads is indicated as W. In order to ensure that the maximum operating temperature of the resistor ink is not exceeded, all laser cuts are made so that no more than 50% of the width W of the resistor is excluded from the current path through the resistor i.e., A must not be less than 50% of W. Resistor power rating is determined by the type of ink and by area. A preferred configuration for the resistors is shown in FIG. 5. This shows a box-type laser cut 16, thus excluding the rectangular zone 18. With this configuration one can achieve a limiting element voltage in excess of 250 V rms for the resistors.

In general, for most safety barriers of this type, a 5 watt resistor is the largest rated resistor which is needed. The ceramic substrate is able to handle the heat dissipation satisfactorily for such resistors.

The ceramic substrate 10 also carries surface mount components, for example zener diodes and fuses, as itemised above. The ground terminals GND1, GND2, GND3 are terminals upstanding from the surface of the substrate 10.

Reference is now made to FIGS. 6 to 9, which show how the substrate and its components are housed for use. The substrate 10 carrying the barrier circuit components is mounted within a housing 20 which comprises two halves 21, 22 of plastics material with the substrate between them. The lower half 22 of the housing is provided with a plurality of upstanding ribs 24 which serve as locators for parts of the assembly. The locator ribs hold the substrate 10 in place, and also leads 26 which extend from the substrate terminals 1 to 6 to six housing terminals set into the housing. The housing terminals are indicated at 101 to 106, corresponding to terminals 1 to 6. They are arranged in a stepped formation in the housing and each comprise a fastening screw 28 for holding an external lead. At the top of the device are provided recesses 30 for replaceable fuses or blanking plugs.

Figure 10:
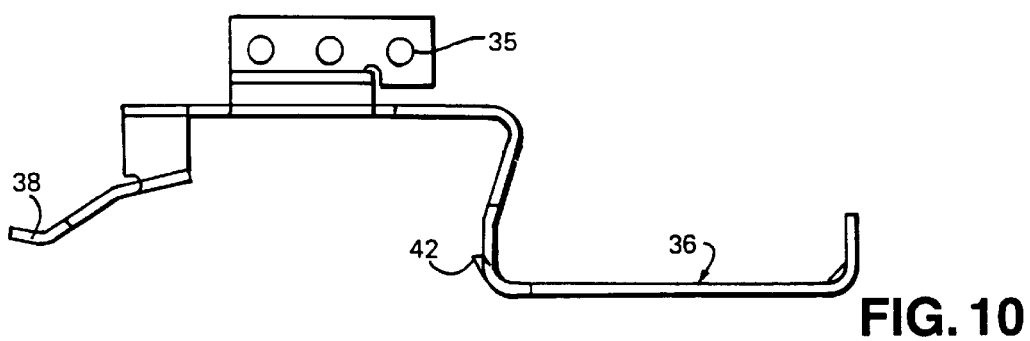
FIG. 10 shows further details of the grounding spring of the ground shoe assembly of the safety barrier; and, Fig. 11 shows details of the ground shoe body which forms the other part of the ground shoe assembly.
Figure 11:
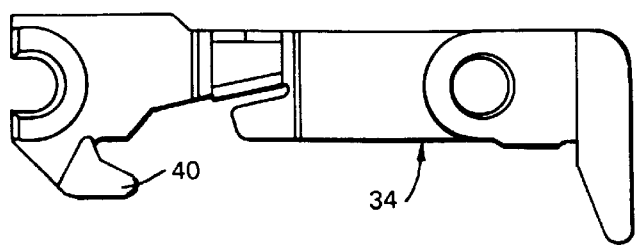
Figure 9:
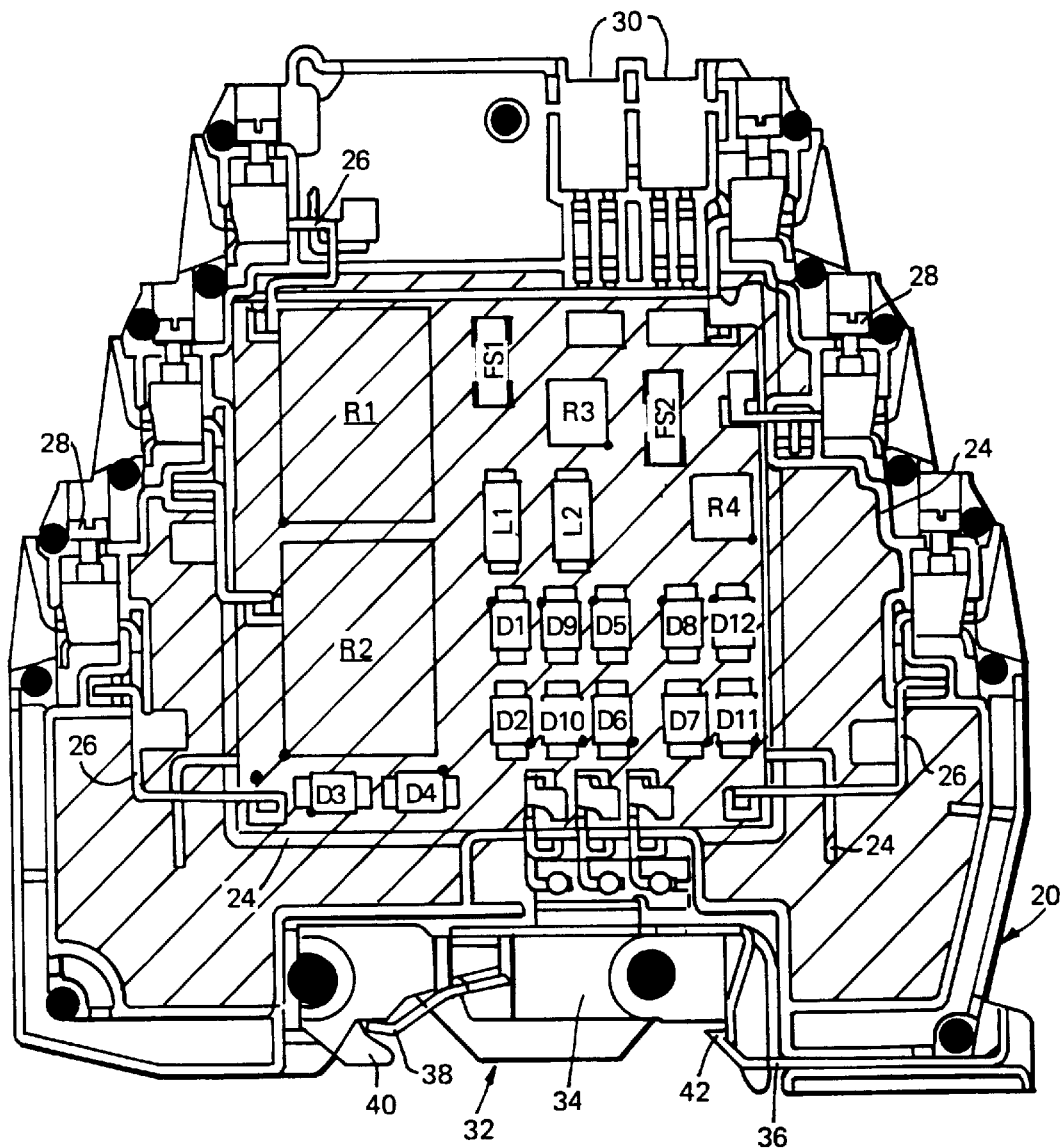
FIG. 9 is a front view of a safety barrier in accordance with the invention having a different pcb layout.

The ceramic substrate 10 and other zones within the lower housing half 22 are encapsulated in an epoxy resin. The area of encapsulation is indicated by the cross-hatching in FIG. 9. In FIG. 9 there are shown four resistors R1 to R4. After encapsulation the device undergoes a test procedure. After this, the ground shoe assembly, indicated generally at 32, is fitted. The ground shoe assembly 22 is in two parts, as shown most clearly in FIGS. 10 and 11. An ground shoe body 34 of silicon brass is fitted fixedly to the housing and functions in co-operation with an ground shoe spring 36 of spring steel. The spring 36 includes a lug 35 having three holes for the location of three grounding current bars. The spring 36 is fitted to the assembly after encapsulation and testing. Attachment is by means of the three current bars which are connected to terminals GND1, GND2 and GND3 respectively of the substrate. The bars engage in the spring holes and are then soldered in place. The ground shoe assembly 32 enables the barrier to be mounted on an associated rail (not shown). The barrier can be snapped into place on the rail. One rail portion fits into the recess 37 formed between a tongue 38 of the spring 36 and a depending lug 40 of the ground shoe body. Another rail portion fits into the recess 39 formed between the ground shoe body and a projection 42 formed on the spring 36.

After encapsulation, testing and fitting of the ground shoe assembly, the two halves 21, 22 of the housing are secured together. This is preferably by heat-staking in a plurality of positions. The positions are indicated by black "dots" in FIGS. 6 and 9. Alternatively, heat-staking can be used in conjunction with an adhesive applied to the mating surfaces of the housing.

The housing 20 is preferably of a polycarbonate material. The total thickness of the safety barrier, i.e. the thickness of the housing, is of the order of 7 mm, which enables a high packing density to be achieved on the associated mounting rail.

We claim:

1. An electrical safety barrier comprising a ceramic substrate and electrical circuit components carried thereon defining a protective circuit between a hazardous area and a non-hazardous area, and at least one thick-film printed resistor on the ceramic substrate, wherein the at least one resistor comprises resistor ink deposited between two tracks on the substrate, the ink being trimmed to a predetermined value so that the width of the current path from track to track is not less than 50% of the full width of the at least one resistor.

2. An electrical safety barrier as claimed in claim 1, comprising surface mounted safety components on the ceramic substrate.

3. An electrical safety barrier as claimed in claim 1, in which a rectangular zone at one side margin of the resistor ink is excluded from the ink zone by the trimming.

4. An electrical safety barrier comprising a ceramic substrate and electrical circuit components carried thereon defining a protective circuit between a hazardous area and a non-hazardous area, wherein the substrate is encapsulated by insulating material and a housing encloses the encapsulated substrate, and a ground shoe assembly carried by the housing and electrically connected to grounding terminals on the substrate.

5. An electrical safety barrier as claimed in claim 4, in which the housing carries terminals for external connections to the barrier, with separate electrical leads connecting the said terminals to respective terminals on the substrate.

6. An electrical safety barrier as claimed in claim 4, in which the ground shoe assembly comprises a body fixedly connected to the housing and a spring associated with the body and cooperating therewith to permit a snap fitting of the assembly to a mounting rail.

\* \* \* \* \*